United States Patent
Uoshima

(10) Patent No.: US 12,235,325 B2
(45) Date of Patent: Feb. 25, 2025

(54) LEARNING METHOD AND OPEN CIRCUIT VOLTAGE ESTIMATION METHOD OF OPEN CIRCUIT VOLTAGE ESTIMATION MODEL OF SECONDARY BATTERY, AND STATE ESTIMATION METHOD OF SECONDARY BATTERY

(71) Applicant: HONDA MOTOR CO., LTD., Tokyo (JP)

(72) Inventor: Minoru Uoshima, Wako (JP)

(73) Assignee: HONDA MOTOR CO., LTD., Tokyo (JP)

( * ) Notice: Subject to any disclaimer, the term of this patent is extended or adjusted under 35 U.S.C. 154(b) by 530 days.

(21) Appl. No.: 17/668,900

(22) Filed: Feb. 10, 2022

(65) Prior Publication Data
US 2022/0283235 A1    Sep. 8, 2022

(30) Foreign Application Priority Data
Mar. 8, 2021    (JP) .................... 2021-036378

(51) Int. Cl.
*G01R 31/388*    (2019.01)
*G01R 31/3828*    (2019.01)
*G06F 18/214*    (2023.01)
*G06N 3/04*    (2023.01)

(52) U.S. Cl.
CPC ....... *G01R 31/388* (2019.01); *G01R 31/3828* (2019.01); *G06F 18/214* (2023.01); *G06N 3/04* (2013.01)

(58) Field of Classification Search
CPC .................................................... G01R 31/388
USPC ............................................................ 320/132
See application file for complete search history.

(56) References Cited

U.S. PATENT DOCUMENTS

| | | | | |
|---|---|---|---|---|
| 2007/0252600 A1* | 11/2007 | Chou | ............. | G01R 31/392 324/430 |
| 2009/0254290 A1* | 10/2009 | Kim | ............. | H01M 10/48 702/63 |
| 2019/0081501 A1* | 3/2019 | Sun | ............. | B60L 58/14 |
| 2021/0063490 A1* | 3/2021 | Naha | ............. | G01R 31/367 |

FOREIGN PATENT DOCUMENTS

| | | | | |
|---|---|---|---|---|
| CN | 112098878 A | * | 12/2020 | ......... G01R 31/3648 |
| JP | 2003249271 A | * | 9/2003 | ........... G01R 31/392 |

* cited by examiner

*Primary Examiner* — Jerry D Robbins
(74) *Attorney, Agent, or Firm* — Rankin, Hill & Clark LLP

(57) ABSTRACT

A learning method of an open circuit voltage estimation model includes training the open circuit voltage estimation model to learn a relationship of the open circuit voltage estimation input data obtained by preprocessing terminal currents and terminal voltages of a secondary battery with an open circuit voltage of the secondary battery. The open circuit voltage estimation input data includes time-series data of: the terminal currents; the terminal voltages; and difference gradients of terminal voltage differences with respect to terminal current differences.

14 Claims, 11 Drawing Sheets

LEARNING METHOD AND OPEN CIRCUIT VOLTAGE ESTIMATION METHOD OF OPEN CIRCUIT VOLTAGE ESTIMATION MODEL OF SECONDARY BATTERY, AND STATE ESTIMATION METHOD OF SECONDARY BATTERY

INCORPORATION BY REFERENCE

The present application claims priority under 35 U.S.C. § 119 to Japanese Patent Application No. 2021-036378 filed on Mar. 8, 2021. The content of the application is incorporated herein by reference in its entirety.

BACKGROUND OF THE INVENTION

Field of the Invention

The present invention relates to a learning method and an open circuit voltage estimation method of an open circuit voltage estimation model for estimating the open circuit voltage of an operating secondary battery, and a state estimation method of a secondary battery using a trained open circuit voltage estimation model.

Description of the Related Art

Secondary batteries, which are storage batteries that can be used repeatedly by charging, are widely used in moving objects such as electric vehicles and electric bicycles, and buildings. When these secondary batteries are used, it is important to appropriately know the state of the secondary batteries for the purpose of knowing appropriate charging timing and replacement timing. Here, the state of the secondary battery means SOC (charge rate, remaining capacity, State Of Charge) and/or SOH (deterioration degree, State Of Health).

In general, charge-discharge characteristics of a secondary battery depend on the electrical characteristics of the secondary battery, such as the SOC-OCV (Open Circuit Voltage) characteristics, and/or the dependence of such electrical characteristics on SOH. Therefore, from the viewpoint of SOC estimation accuracy, it is desirable to use the OCV of the secondary battery as input to a state estimation model of the secondary battery using a neural network, for example. However, it is difficult to accurately measure OCV in a secondary battery, such as an in-vehicle battery connected to a traveling motor of a vehicle, in which discharge and regeneration (charging) are frequently repeated during traveling.

Therefore, the conventional method is, instead of measuring the OCV of an operating secondary battery, measuring the internal resistance of the secondary battery, which is closely related to OCV, and inputting the measured internal resistance to the state estimation model (see, for example, Japanese Patent Laid-Open No. 2003-249271). Such internal resistance is generally measured by inputting an AC signal for measuring internal resistance between the terminals of the secondary battery by superimposing it on the charge-discharge current of the secondary battery.

However, in the measurement of internal resistance by superimposing an AC signal, a measured value just indirectly represents a present OCV, and does not necessarily represent the present OCV accurately. In addition, the electrical characteristics of the secondary batteries may vary depending on the manufacturers and/or models of the secondary batteries. Therefore, the above-mentioned conventional technique, in which the measured values of the voltages V, the currents I, and the internal impedances Z of the secondary battery are directly input to the neural network when the neural network is trained, has difficulty in determining secondary batteries with different electrical characteristics of various manufacturers and/or models to be estimated, for accurately estimating those SOC and the like.

In other words, if the present OCV can be estimated accurately for various operating secondary batteries with different electrical characteristics in estimating the state of the secondary battery, the estimation accuracy could improve in estimating state for secondary batteries of various manufacturers and/or models.

The present invention has been made in view of the above-mentioned circumstances, and an object of the present invention is to accurately estimate open circuit voltages (OCV) of various operating secondary batteries with different electrical characteristics.

SUMMARY OF THE INVENTION

An aspect of the present invention is a learning method of an open circuit voltage estimation model of a secondary battery, the learning method using machine learning, the open circuit voltage estimation model estimating an open circuit voltage of the operating secondary battery, the secondary battery being connected to a load or a charger, the learning method including:
  a step of measuring state variables at predetermined time intervals, the state variables including terminal currents and terminal voltages of the operating secondary battery;
  a step of calculating voltage estimation input data by preprocessing the state variables; and
  a step of training the open circuit voltage estimation model to learn a relationship of the voltage estimation input data with the open circuit voltage of the operating secondary battery, by machine learning,
  wherein the step of calculating:
    uses time-series data of the terminal currents and time-series data of the terminal voltages to calculate current differences and voltage differences, each current difference being a difference in the terminal currents, each voltage difference being a difference in the terminal voltages;
    uses time-series data of the current differences and time-series data of the voltage differences to calculate difference gradients, each difference gradient being a change rate of the voltage differences with respect to the current differences in a period to a present from a past that goes back a first predetermined time from the present; and
    generates the voltage estimation input data including time-series data of the terminal currents, time-series data of the terminal voltages, and time-series data of the difference gradients.

According to yet another aspect of the present invention, each difference gradient is calculated using the least squares method.

According to yet another aspect of the present invention, each current difference and each voltage difference are respectively a fourth-order difference of time-series data of the terminal currents and a fourth-order difference of time-series data of the terminal voltages.

According to yet another aspect of the present invention, the open circuit voltage estimation model is configured of an RNN (Recurrent Neural Network).

According to yet another aspect of the present invention, an intermediate layer of the RNN configuring the open circuit voltage estimation model is configured of an LSTM (Long Short Term Memory) or a GRU (Gated Recurrent Unit).

According to yet another aspect of the present invention, the open circuit voltage estimation model is configured of one-dimensional CNN (Convolutional Neural Network).

According to yet another aspect of the present invention, the open circuit voltage estimation model is generated by learning using time-series data of state variables including terminal currents and terminal voltages for each of a plurality of secondary batteries with different electrical characteristics, the secondary batteries each being connected to a load or a charger.

Yet another aspect of the present invention is an open circuit voltage estimation method of a secondary battery, including:

a step of measuring state variables at predetermined time intervals, state variables including terminal currents and terminal voltages of the operating secondary battery;

a step of calculating voltage estimation input data by preprocessing the state variables; and a step of estimating an open circuit voltage of the operating secondary battery, from the voltage estimation input data, using an open circuit voltage estimation model trained by a learning method of the open circuit voltage estimation model of the secondary battery according to any one of the above, wherein the step of calculating:

uses time-series data of the terminal currents and time-series data of the terminal voltages to calculate current differences and voltage differences, each current difference being a difference in the terminal currents, each voltage difference being a difference in the terminal voltages;

uses time-series data of the current differences and time-series data of the voltage differences to calculate difference gradients, each difference gradient being a change rate of the voltage differences with respect to the current differences in a period to a present from a past that goes back a first predetermined time from the present; and generates the voltage estimation input data including time-series data of the terminal currents, time-series data of the terminal voltages, and time-series data of the difference gradients.

Yet another aspect of the present invention is a state estimation device of a secondary battery the state estimation device estimating a state of the operating secondary battery, the device including a processor, wherein the processor is configured to:

measure state variables at predetermined time intervals, the state variables including terminal currents and terminal voltages of the operating secondary battery;

perform preprocessing of the measured state variables, to calculate input data; and perform estimation of a present charge rate and/or a deterioration degree of the operating secondary battery, based on the input data, wherein in the estimation, the processor: estimates a present open circuit voltage of the operating secondary battery, using an open circuit voltage estimation model trained by a learning method of the open circuit voltage estimation model of the secondary battery according to any one of the above; and uses the estimated open circuit voltage to estimate the present charge rate and/or deterioration degree of the operating secondary battery.

According to an aspect of the present invention, it is possible to accurately estimate the open circuit voltage of an operating secondary battery having various electrical characteristics of different manufacturers and models.

DETAILED DESCRIPTION OF THE PREFERRED EMBODIMENTS

The inventor of the invention of the present application has found that there is a correlation between: a change mode of terminal current and terminal voltage changes of secondary batteries, that is, a high-order change mode; and an internal state (OCV, SOC and or SOH) of the secondary batteries, at least among the secondary batteries in the same type (for example, the secondary batteries in "lithium ion batteries" that are identical as the type). Then, the inventor has obtained knowledge such that: a parameter expressing a high-order change mode of terminal current and terminal voltage of the secondary battery to be used is determined to be a change rate (difference gradient to be described below) of the differences in time-series data of the terminal voltages (voltage differences) with respect to the differences in time-series data of the terminal currents (current differences); this parameter is determined to be an input for a model (for example, a neural network); and thereby there can be generated a model that can accurately estimate a state of secondary batteries with various electrical characteristics of different manufacturers and models. The invention of the present application is based on such outstanding knowledge.

The following describes embodiments of the present invention with reference to the drawings.

First Embodiment

Figure 1:
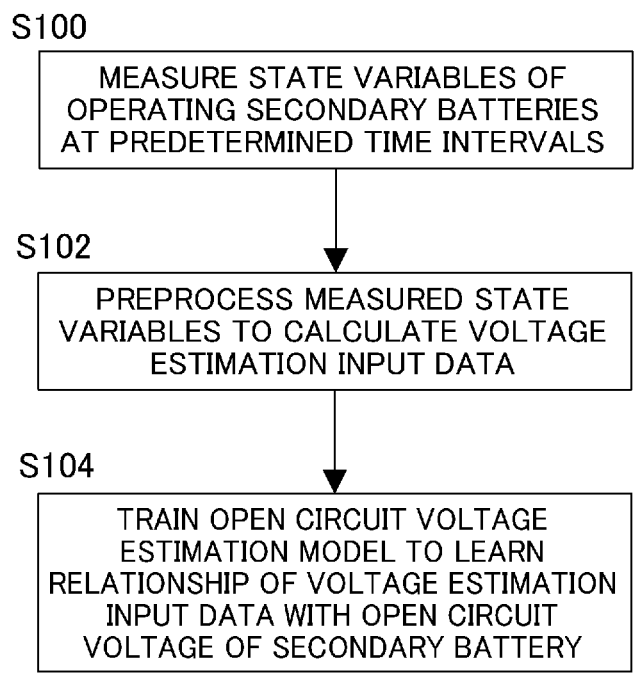
FIG. 1 is a flow chart showing a procedure of a learning method of an open circuit voltage estimation model according to a first embodiment of the present invention.

FIG. 1 is a diagram showing a procedure of a learning method of an open circuit voltage estimation model of a secondary battery according to a first embodiment of the present invention. The learning method of this open circuit voltage estimation model includes: a step (S100) of measuring state variables including terminal currents and terminal voltages of an operating secondary battery to which a load or a charger is connected, at predetermined time intervals; and a step (S102) of preprocessing the measured state variables to calculate voltage estimation input data. In addition, the learning method of this open circuit voltage estimation model includes: a step (S104) of training the open circuit voltage estimation model to learn a relationship between the calculated voltage estimation input data and open circuit voltages of the operating secondary battery by machine learning.

Figure 2:
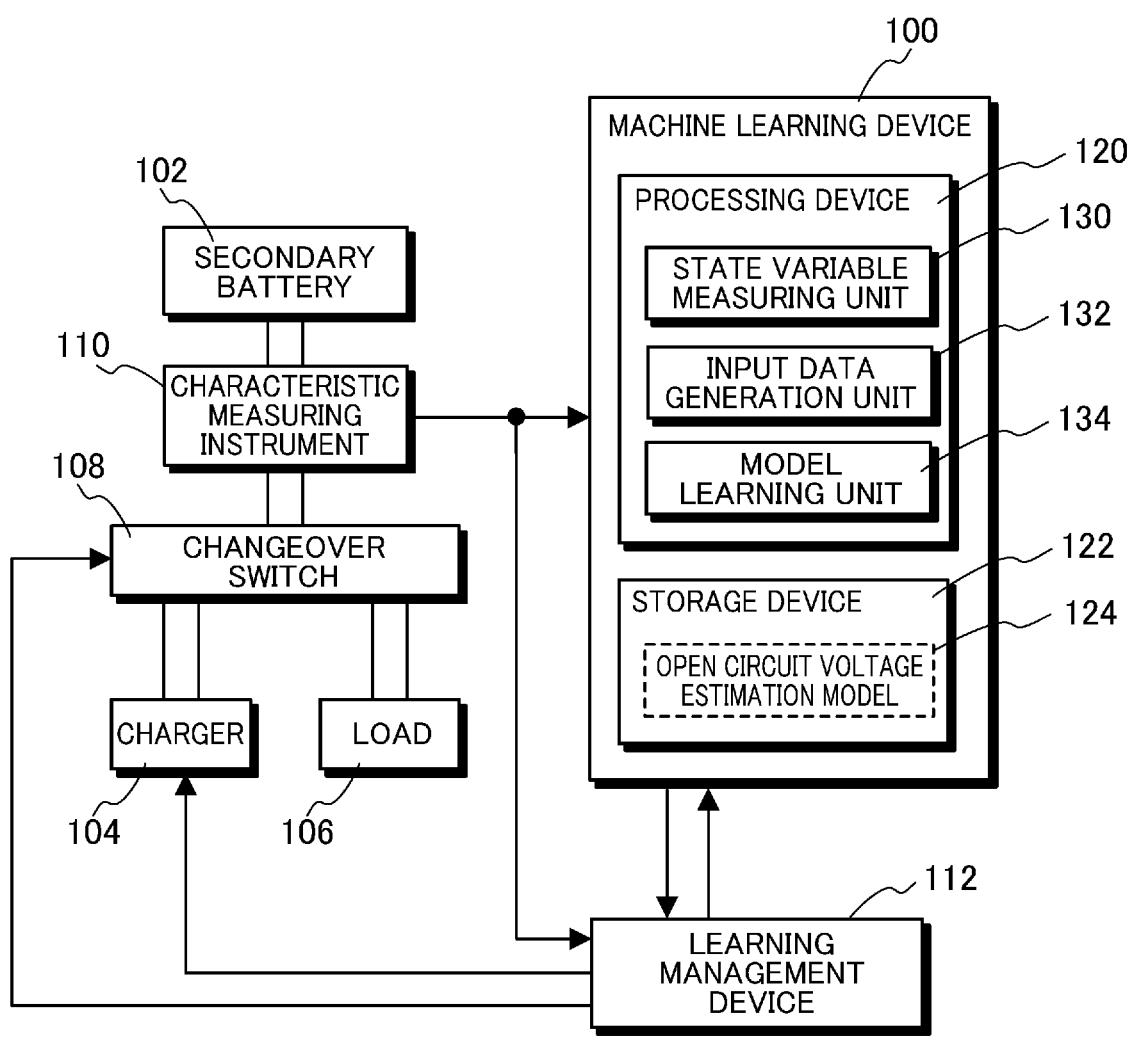
FIG. 2 is a diagram showing a configuration of a machine learning device that executes the learning method of the open circuit voltage estimation model shown in FIG. 1.

FIG. 2 is a diagram showing an example of the configuration of a learning management device and a machine learning device that execute the learning method of the open circuit voltage estimation model shown in FIG. 1. The open circuit voltage estimation model is configured of, for example, a neural network. A learning management device 112 controls the operation of a secondary battery 102 during the machine learning, calculates the measured values of the open circuit voltages as teacher data, and provides a machine learning device 100 with the measured values.

The secondary battery 102 is charged by the charger 104 and discharged by energizing the load 106. The charger 104 is, for example, a DC power source, and the load 106 is, for example, a motor. Whether to charge the secondary battery 102 from the charger 104 or discharge it to the load 106 is chosen by the changeover switch 108. The changeover switch 108 and the secondary battery 102 have a characteristic measuring instrument 110 inserted therebetween.

The characteristic measuring instrument 110 measures the present values of predetermined state variables of the secondary battery 102. The predetermined state variables may include a terminal voltage Vte, a terminal current Ite, an internal impedance Z of the secondary battery 102, and a temperature T (° C.) of the housing surface of the secondary battery 102. Here, the internal impedance Z can be measured according to the prior art, for example, by inputting an alternating current, which is a measurement signal, to the secondary battery 102. The terminal current Ite of the secondary battery 102 takes a positive value when the secondary battery 102 discharges and takes a negative value when it charges.

[1. Learning Management Device]

The learning management device 112 controls charge-discharge of the secondary battery 102, generates teacher data for training the open circuit voltage estimation model, and outputs the teacher data to the machine learning device 100. The learning management device 112 is, for example, a computer, which starts an operation according to an instruction from an operator, and gives an instruction to start and stop the power output to the charger 104 and an instruction to change the operation to the changeover switch 108.

The learning management device 112 acquires a terminal current Ite, a terminal voltage Vte, and an internal impedance Z of the secondary battery 102 during charging and discharging from the characteristic measuring instrument 110 at predetermined time intervals.

The learning management device 112 calculates the open circuit voltage Voc of the secondary battery 102 from the acquired terminal current Ite, terminal voltage Vte, and internal impedance Z, and generates time-series data of the open circuit voltages Voc. The time-series data of the open circuit voltages Voc is used as teacher data at the time of training the open circuit voltage estimation model executed by the machine learning device 100 to be described below.

[2. Machine Learning Device]

The machine learning device 100 executes the learning method of the open circuit voltage estimation model shown in FIG. 1. The machine learning device 100 includes a processing device 120 and a storage device 122. The storage device 122 is composed of, for example, a volatile and/or non-volatile semiconductor memory, a hard disk device, or the like. The storage device 122 stores an open circuit voltage estimation model 124 generated by a model learning unit 134 to be described below.

The processing device 120 is, for example, a computer including a processor such as a CPU (Central Processing Unit). The processing device 120 may have a configuration including a ROM (Read Only Memory) in which a program is written, a RAM (Random Access Memory) for temporarily storing data. The processing device 120 includes a state variable measuring unit 130, an input data generation unit 132, and a model learning unit 134, which serve as functional elements or functional units.

These functional elements included in the processing device 120 are embodied, for example, by the processing device 120, which is a computer, executing a program. Note that the computer program can be stored in any computer-readable storage medium. Alternatively, all or part of the functional elements included in the processing device 120 may be configured by hardware including one or more electronic circuit components.

[2.1. Function of State Variable Measuring Unit]

The state variable measuring unit 130 executes the step S100 shown in FIG. 1. In other words, the state variable measuring unit 130 acquires a state variable including the terminal current Ite and the terminal voltage Vte of the secondary battery 102 to which the load 106 or the charger 104 is connected, from the characteristic measuring instrument 110 at predetermined time intervals. Thus, the state variable measuring unit 130 measures the state variables at predetermined time intervals. The state variable measuring unit 130 may further measure the temperature T of the secondary battery 102, which is a state variable, at the predetermined time intervals.

[2.2. Functions of Input Data Generation Unit]

The input data generation unit 132 executes the step S102 shown in FIG. 1. In other words, the input data generation unit 132 preprocesses the state variables measured by the state variable measuring unit 130 to calculate the voltage estimation input data.

Figure 3:
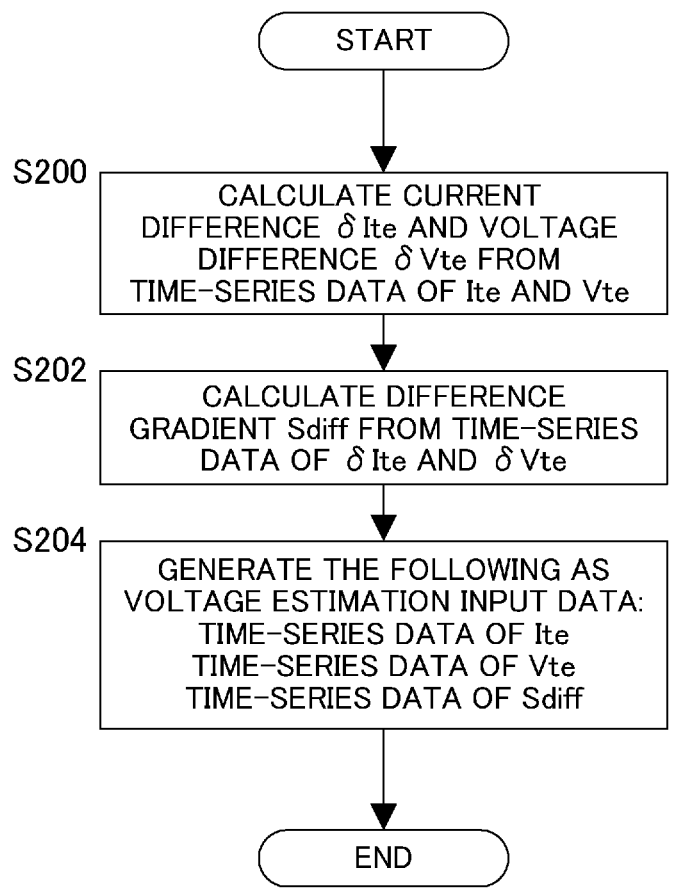
FIG. 3 is a flow chart showing details of processing in a step of calculating voltage estimation input data in the learning method of the open circuit voltage estimation model shown in FIG. 1.

FIG. 3 is a flow chart showing details of the processing in the step S102 of calculating the voltage estimation input data in FIG. 1. In the step S102 of calculating the voltage estimation input data, the input data generation unit 132 first calculates the current differences $\delta Ite$ and the voltage differences $\delta Vte$, from the time-series data of the terminal currents Ite and the time-series data of the terminal voltages Vte. Each current difference $\delta Ite$ is the difference in the terminal currents Ite, and each voltage difference $\delta Vte$ is the difference in the terminal voltages Vte (S200). Then, the input data generation unit 132 calculates the difference gradient Sdiff (S202) in the period to the present from the past that goes back the predetermined time T1 from the present. The difference gradient Sdiff is the change rate of the voltage difference δVte with respect to the current difference δIte.

Then, the input data generation unit 132 generates the state estimation input data including, the following three time-series data (S204) in a period to the present from the past that goes back a predetermined time T2 from the present, and ends the processing:

time-series data of terminal currents Ite,
time-series data of terminal voltages Vte, and
time-series data of the difference gradients Sdiff.

The following describes: a specific method of calculating the current difference δIte, the voltage difference δVte, and the difference gradient Sdiff.

[2.2.2.1. Calculation of Current Difference δIte]

Figure 4:
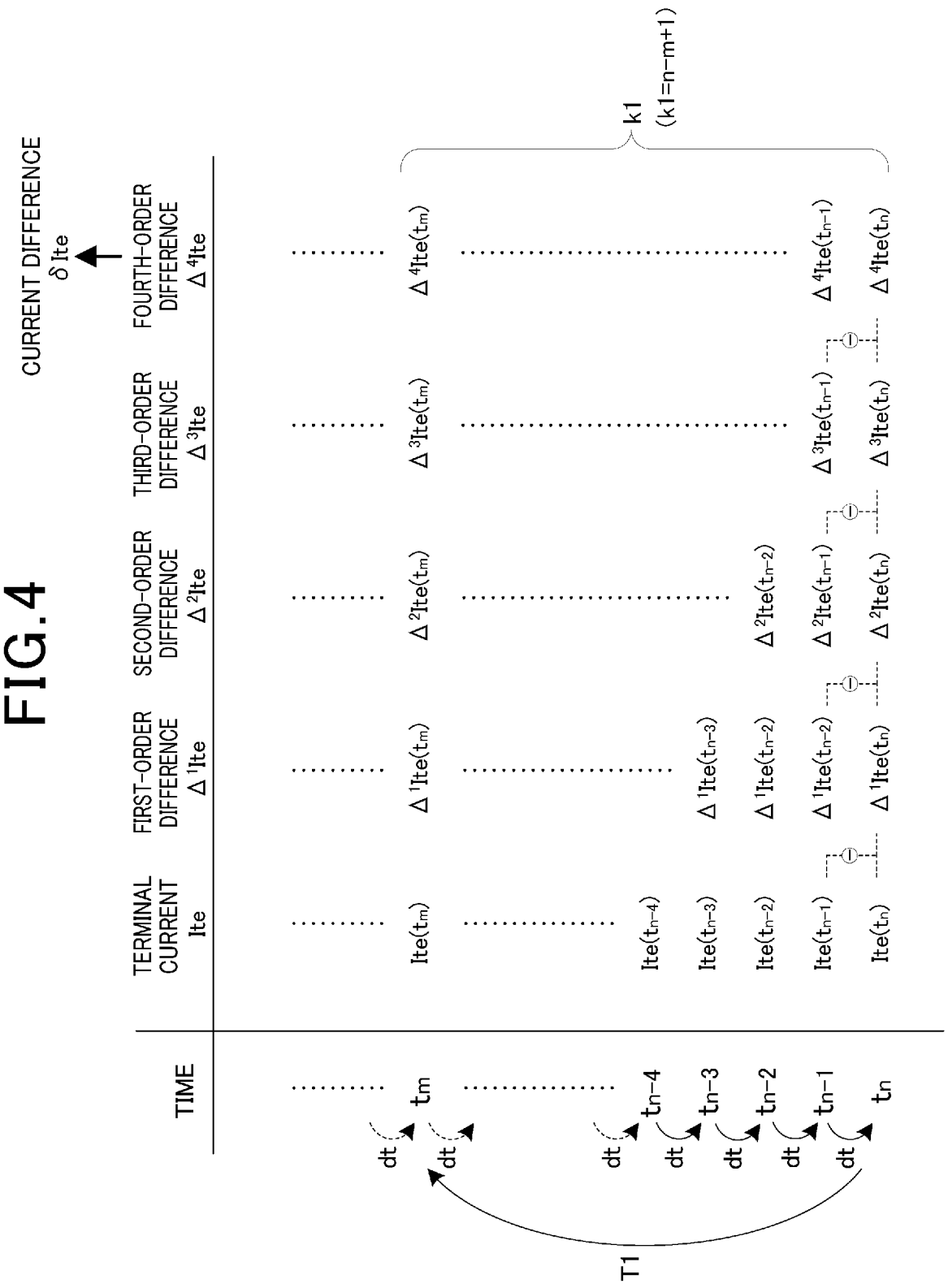
FIG. 4 is a diagram for describing a calculation of a current difference in the processes shown in FIG. 3.

FIG. 4 is a diagram for explaining the calculation of the current difference δIte. In the table shown in FIG. 4, the leftmost column is the first column, and toward the right, there are the second column, the third column, and finally the sixth column. The first column of the table of FIG. 4 indicates the time when the state variable measuring unit 130 repeatedly acquires the terminal current Ite at the time interval dt or the index (number) of the time. The second column is the time-series data of the terminal currents Ite, and indicates the terminal current Ite acquired at each time.

The third, fourth, fifth, and sixth columns respectively indicate the first-order difference $\Delta^1$Ite, the second-order difference $\Delta^2$Ite, the third-order difference $\Delta^3$Ite, and the fourth-order difference $\Delta^4$Ite of the terminal current Ite, which are calculated from the terminal current Ite in the second row.

The hth-order difference $\Delta^h$Ite($t_n$) (h=1, 2, . . . 4) at the present time $t_n$ is calculated by the following expression.

$$\Delta^h Ite(t_n) = \Delta^{h-1} Ite(t_n) - \Delta^{h-1} Ite(t_{n-1})$$

where h=1, 2, 3, 4. In addition, it is assumed that $\Delta^0$Ite($t_n$)=Ite($t_n$).

In other words, the first-order difference $\Delta^1$Ite($t_n$) at the time $t_n$ is calculated by subtracting the terminal current Ite($t_{n-1}$) at time $t_{n-1}$ from the terminal current Ite($t_n$) at the time $t_n$. Furthermore, the second-order difference $\Delta^2$Ite($t_n$) at the time $t_n$ is calculated by subtracting the first-order difference $\Delta^1$Ite($t_{n-1}$) at the time $t_{n-1}$ from the first-order difference $\Delta^1$Ite($t_n$) at the time $t_n$.

Similarly, the third-order difference $\Delta^3$Ite($t_n$) at the time $t_n$ is calculated by subtracting the second-order difference $\Delta^2$Ite($t_{n-1}$) at the time $t_{n-1}$ from the second-order difference $\Delta^2$Ite($t_n$) at the time $t_n$. Similarly, the fourth-order difference $\Delta^4$Ite($t_n$) at the time $t_n$ is calculated by subtracting the third-order difference $\Delta^3$Ite($t_{n-1}$) at the time $t_{n-1}$ from the third-order difference $\Delta^3$Ite($t_n$) at the time $t_n$.

In this embodiment, the input data generation unit 132 determines the fourth-order difference $\Delta^4$Ite of the terminal current Ite at each time to be the current difference δIte. In other words, $$\delta Ite(t) = \Delta^4 Ite(t), \text{ where } t = t_n, t_{n-1}, \ldots$$

[2.2.2.2. Calculation of Voltage Difference δVte]

Figure 5:
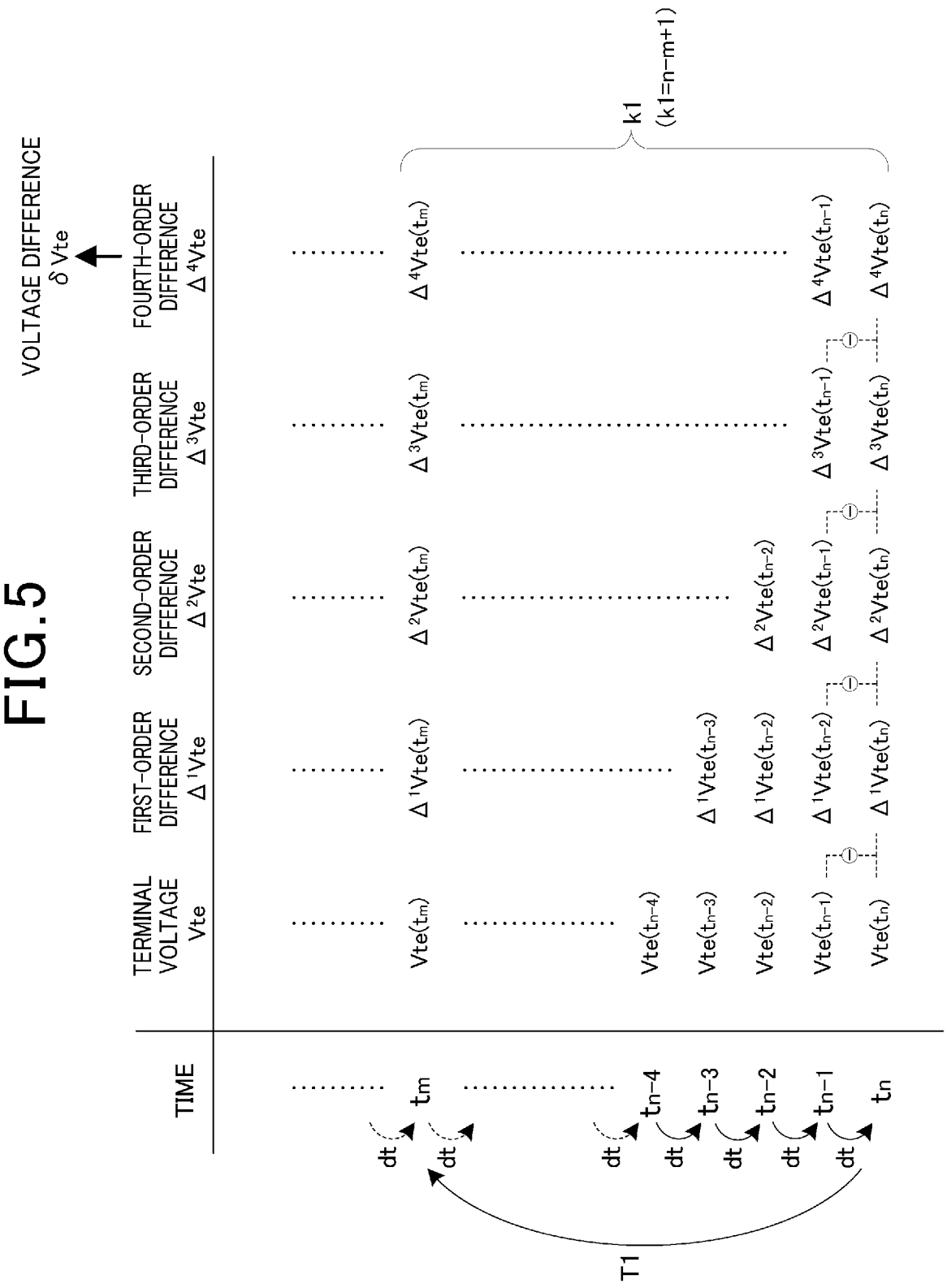
FIG. 5 is a diagram for describing a calculation of a voltage difference in the processes shown in FIG. 3.

The input data generation unit 132 calculates the voltage difference δVte of the terminal voltage Vte in the same manner as the current difference described above. FIG. 5 is a diagram showing a procedure for calculating the voltage difference δVte. In the table shown in FIG. 5, the leftmost column is the first column, and toward the right, there are the second column, the third column, and finally the sixth column. The first column of the table of FIG. 5 indicates the time when the state variable measuring unit 130 repeatedly acquires the terminal voltage Vte at the time interval dt or the index (number) of the time. The second column is the time-series data of the terminal voltages Vte, and indicates the terminal voltage Vte acquired at each time.

The third, fourth, fifth, and sixth columns respectively indicate the first-order difference $\Delta^1$Vte, the second-order difference $\Delta^2$Vte, the third-order difference $\Delta^3$Vte, and the fourth-order difference $\Delta^4$Vte of the terminal voltage Vte, which are calculated from the terminal voltage Vte in the second column.

The hth-order difference $\Delta^h$Vte($t_n$) (h=1, 2, . . . 4) at the present time $t_n$ is calculated by the following expression.

$$\Delta^h Vte(t_n) = \Delta^{h-1} Vte(t_n) - \Delta^{h-1} Vte(t_{n-1})$$

where h=1, 2, 3, 4.

In addition, it is assumed that $\Delta^0$Vte($t_n$)=Vte($t_n$).

In other words, the first-order difference $\Delta^1$Vte($t_n$) at the time $t_n$ is calculated by subtracting the terminal voltage Vte($t_{n-1}$) at the time $t_{n-1}$ from the terminal voltage Vte($t_n$) at the time $t_n$. In addition, the second-order difference $\Delta^2$Vte ($t_n$) at the time $t_n$ is calculated by subtracting the first-order difference $\Delta^1$Vte($t_{n-1}$) at the time $t_{n-1}$ from the first-order difference $\Delta^1$Vte($t_n$) at the time $t_n$.

Similarly, the third-order difference $\Delta^3$Vte($t_n$) at the time $t_n$ is calculated by subtracting the second-order difference $\Delta^2$Vte($t_{n-1}$) at the time $t_{n-1}$ from the second-order difference $\Delta^2$Vte($t_n$) at the time $t_n$. Similarly, the fourth-order difference $\Delta^4$Vte($t_n$) at the time $t_n$ is calculated by subtracting the third-order difference $\Delta^3$Vte($t_{n-1}$) at the time $t_{n-1}$ from the third-order difference $\Delta^3$Vte($t_n$) at the time $t_n$.

In this embodiment, the input data generation unit 132 determines the fourth-order difference $\Delta^4$Vte of the terminal voltage Vte at each time to be the voltage difference δVte. In other words, $$\delta Vte(t) = \Delta^4 Vte(t)$$

where t=$t_n$, $t_{n-1}$, . . .

[2.2.2.3. Calculation of Difference Gradient Sdiff]

The difference gradient Sdiff is the change rate of the voltage difference δVte with respect to the current difference δIte in the period to the present from the past that goes back the predetermined time T1 from the present. Specifically, as shown in FIGS. 4 and 5, the input data generation unit 132 extracts k1 (k1=n−m+1) of current differences δIte and k1 of voltage differences δVte between the past time $t_m$ and the present time $t_n$, which corresponds to the period to the present from the past that goes back the predetermined time T1 from the present. Then, the input data generation unit 132 uses the data set (δIte, δVte) each time configured of the extracted δIte and δVte to calculates the difference gradient Sdiff by the least squares method. The difference gradient Sdiff is the change rate of the voltage difference δVte with respect to the current difference δIte.

Figure 6:
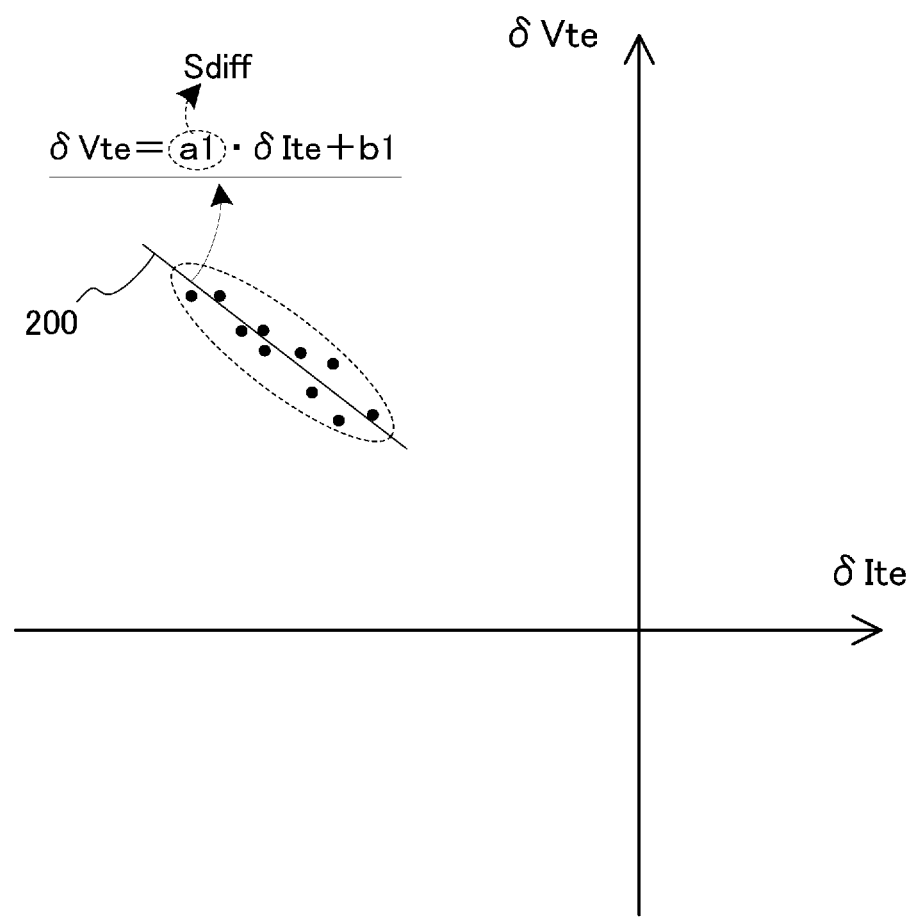
FIG. 6 is a diagram for describing a calculation of a difference gradient in the processes shown in FIG. 3.

More specifically, as shown in FIG. 6, the above k1 of data sets (δIte, δVte) are plotted on a two-dimensional plane having the current difference δIte as the horizontal axis and the voltage difference δVte as the vertical axis. The plot is represented by a black circle in the illustrated dotted ellipse. The slope of the approximate straight line (regression straight line) 200 of this plot corresponds to the difference gradient Sdiff. In other words, when the approximate straight line 200 is given by δVte=a1×δIte+b1, the slope a1 of the approximate straight line 200 corresponds to the difference gradient Sdiff. Here, the approximate straight line is calculated by, for example, the least squares method.

[2.2.2.5. Voltage Estimation Input Data]

As described above, the voltage estimation input data is configured of time-series data of the terminal currents Ite, the terminal voltages Vte, and the difference gradients Sdiff in the period to the present from the past that goes back the predetermined time T2 from the present. Assuming that the present time is $t_n$ and the past time that goes back the predetermined time T2 from the present is $t_r$, the voltage estimation input data is expressed by the following expression.

[Expression 1]

$$^{V}x1(t_n) = \begin{pmatrix} ^{v}Ite(t_n) \\ ^{v}Vte(t_n) \\ ^{v}Sdiff(t_n) \end{pmatrix} \text{ where} \quad (1)$$

$$^{v}Ite(t_n) = (Ite(t_r), Ite(t_{r+1}), Ite(t_{r+2}), \ldots, Ite(t_n))$$

$$^{v}Vte(t_n) = (Vte(t_r), Vte(t_{r+1}), Vte(t_{r+2}), \ldots, Vte(t_n))$$

$$^{v}Sdiff(t_n) = (Sdiff(t_r), Sdiff(t_{r+1}), Sdiff(t_{r+2}), \ldots, Sdiff(t_n)).$$

Here, the time-series data $^{V}Ite(t_n)$ of the terminal currents Ite, the time-series data $^{V}Vte(t_n)$ of the terminal voltages Vte, and the time-series data $^{V}Sdiff(t_n)$ of the difference gradients Sdiff are respectively first-order tensors having n−r+1 values of terminal current Ite, terminal voltage Vte, and difference gradient Sdiff from time $t_r$ to time $t_n$ as elements. Therefore, the voltage estimation input data $^{V}x1(t_n)$ is a second-order tensor.

[2.3. Functions of Model Learning Unit]

The model learning unit 134 executes the step S104 of the learning method of the open circuit voltage estimation model shown in FIG. 1 to generate an open circuit voltage estimation model 124 by machine learning. Specifically, the model learning unit 134 trains the open circuit voltage estimation model 124 by machine learning using the voltage estimation input data generated by the input data generation unit 132. At that time, the model learning unit 134 acquires, for example, the time-series data of the open circuit voltages Voc of the secondary battery 102 from the learning management device 112, and performs the machine learning using the acquired time-series data of the open circuit voltages Voc as teacher data.

Figure 7:
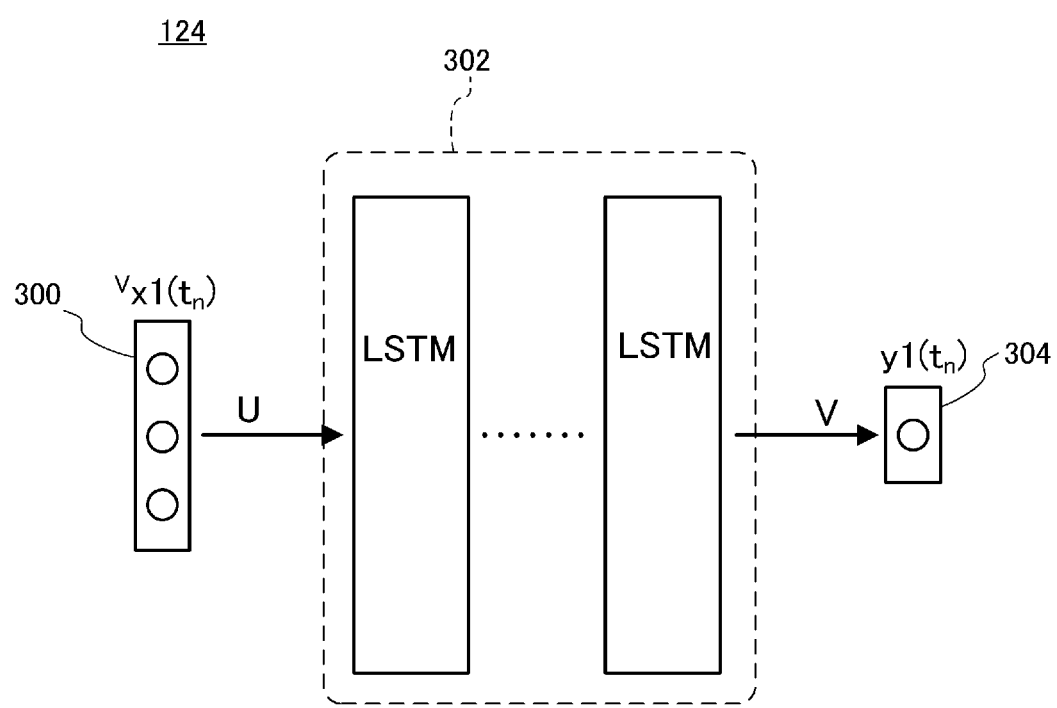
FIG. 7 is a diagram showing an example of the configuration of an open circuit voltage estimation model generated by a model learning unit of the machine learning device shown in FIG. 2.

FIG. 7 is a diagram showing the configuration of the open circuit voltage estimation model 124 generated by the model learning unit 134. The open circuit voltage estimation model 124 is configured of a neural network and has an input layer 300, an intermediate layer 302, and an output layer 304. The open circuit voltage estimation model 124 is, for example, an RNN (Recurrent Neural Network).

The input layer 300 receives the voltage estimation input data of the second-order tensor represented by the above expression (1). In this embodiment, the intermediate layer 302 includes an LSTM (Long Short Term Memory) configured in multiple layers. However, the intermediate layer 302 is not limited to the LSTM. For example, the intermediate layer 302 may be configured of a GRU (Gated Recurrent Unit).

The output layer 304 outputs the estimated value of the open circuit voltage Voc at the time $t_n$ of the secondary battery 102 as the output $y1(t_n)$. In other words, the output $y1(t_n)$ is an open circuit voltage $Voc(t_n)$ as a scalar quantity.

[3. Secondary Battery Used for Model Learning]

The secondary batteries 102 used for the model learning are desirably a plurality of various secondary batteries having different manufacturers and models, and different electrical characteristics. This can generate an open circuit voltage estimation model 124 in which the estimation accuracy does not change much for manufacturers and models. For example, in training the open circuit voltage estimation model 124, it is desirable to use a plurality of secondary batteries having different electrical characteristics such as SOC-OCV characteristics, SOC-internal impedance characteristics, and/or their SOH dependence.

[4. Operation Mode of Secondary Battery in Model Learning]

The operation mode (charge-discharge story) of the secondary battery in model learning is desirably not only monotonously discharging or charging between a fully charged state (SOC=100%) and a fully discharged state (SOC=0%), but also randomly charging and discharging, and/or alternately charging and discharging according to predetermined criteria. Such predetermined criteria can be a standard according to the use of the secondary battery to be estimated. For example, when a secondary battery for a vehicle is to be estimated, the criteria to be used can adjust to follow the typical charge-discharge cycle in vehicle driving in various traffic scenes such as urban areas, mountainous areas, rural areas, and highways.

[5. Collection of Learning Data]

In this embodiment, the state variables (Ite, Vte) of the secondary battery 102, which is the source of the learning data of the open circuit voltage estimation model 124, and the time-series data of OCV, which are teacher data, are acquired from the characteristic measuring instrument 110 by the machine learning device 100, and are calculated by the learning management device 112 and immediately used for training the open circuit voltage estimation model 124. However, the time-series data of these state variables and teacher data do not necessarily need to be used immediately for learning.

The time-series data of the state variables and the time-series data of the teacher data may be acquired and stored in advance by the learning management device 112 operating the secondary battery. The machine learning device 100 may acquire the time-series data of the state variables and the time-series data of the teacher data stored in the learning management device 112 from the learning management device 112, and train the open circuit voltage estimation model 124.

In addition, the time-series data of the state variables and the time-series data of the teacher data may be generated by a computer simulating the charge-discharge characteristics obtained from the design data such as the equivalent circuit of the secondary battery 102, as long as the error from the actual data is within a range that has no practical problem.

[6. Example of Open Circuit Voltage Estimation by Open Circuit Voltage Estimation Model]

Figure 8:
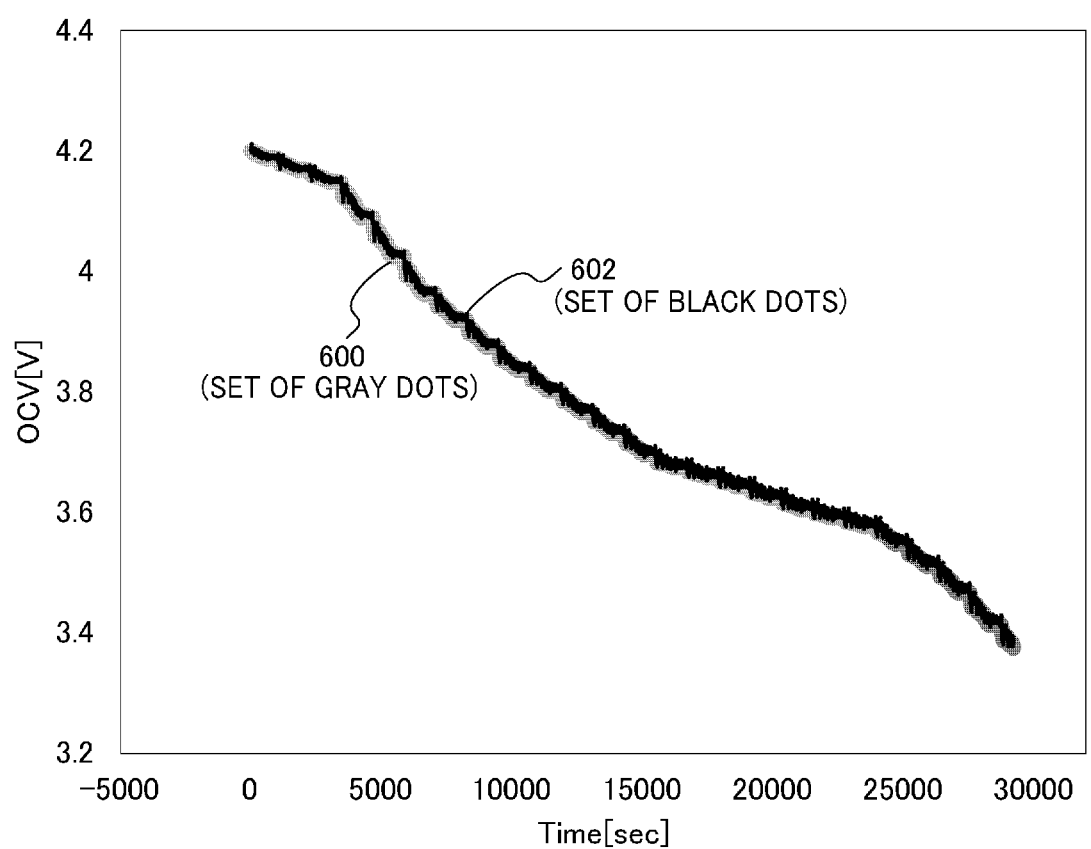
FIG. 8 is a diagram showing an example of an open circuit voltage estimation of a secondary battery performed using a trained open circuit voltage estimation model.

The following describes an example of an open circuit voltage estimation of a secondary battery using the trained open circuit voltage estimation model by the learning method according to this embodiment. FIG. 8 is a diagram showing an example of an open circuit voltage estimation of a secondary battery performed using a trained open circuit voltage estimation model.

The training data for the open circuit voltage estimation model is generated by a computer simulating the charge-discharge characteristics of sample secondary batteries, for vehicles, in dozens of types with different electrical characteristics. Specifically, the above computer simulation calculates the terminal current Ite and terminal voltage Vte, and open circuit voltage at each predetermined time interval dt in charging and discharging according to a predetermined charge-discharge story, for each of the sample secondary batteries in dozens of types with different electrical characteristics, which are SOC-OCV characteristics, internal impedance characteristics, and capacitive characteristics (SOH).

The above charge-discharge story includes: not only monotonously discharging or charging the sample secondary batteries between a fully charged state (SOC=100%) and a fully discharged state (SOC=0%); but also adjusting to follow the typical charge-discharge cycle in vehicle driving in various traffic scenes such as urban areas, mountainous areas, rural areas, and highways.

The sample secondary batteries are lithium ion batteries. The measurement interval dt of the state variable is 100 ms, and the predetermined times T1 and T2 in calculating the voltage estimation input data of the above-mentioned open circuit voltage estimation model are both 5 seconds. The numerical values of these times are examples, and the predetermined times T1 and T2 may be set to different time values from the above.

FIG. 8 shows estimation results of open circuit voltages using the trained open circuit voltage estimation model and simulated values of open circuit voltage for one secondary battery randomly chosen from the above sample secondary batteries, as a battery to be estimated (hereinafter referred to as a target secondary battery), in a period when the target secondary battery discharges from the fully charged state to the fully discharged state.

In FIG. 8, the horizontal axis represents the elapsed time after the start of discharging when the secondary battery starts discharging from the fully charged state, and the vertical axis represents the open circuit voltage (OCV) (unit: V) of the target secondary battery. The voltage estimation input data given to the open circuit voltage estimation model in the open circuit voltage estimation is calculated based on Ite and Vte for each predetermined time interval dt in discharging the target secondary battery, in which the Ite and Vte are calculated from the charge-discharge characteristics of the target secondary battery by simulation.

In FIG. 8, a line 600 formed by a set of gray dots is open circuit voltage values calculated by simulation from the charge-discharge characteristics of the target secondary battery. A line 602 formed by a set of black dots is open circuit voltage estimated values estimated by the open circuit voltage estimation model.

The contrast between the line 600 and line 602 shown in FIG. 8 shows that the open circuit voltage estimation model trained by the learning method shown in this embodiment accurately estimates the open circuit voltage of the target secondary battery. In particular, although the open circuit voltage estimation model used for this estimation is generated using learning data for the sample secondary batteries in dozens of types with different electrical characteristics, the open circuit voltage estimated values obtained from the open circuit voltage estimation model each focuses on one line (line 602) without divergence, and accurately estimates the open circuit voltage for a specific target secondary battery. This indicates that the open circuit voltage estimation model trained by the learning method shown in this embodiment, which performs learning using a plurality of secondary batteries with different electrical characteristics, can accurately estimate the open circuit voltage of a variety of operating secondary batteries having different manufacturers and models.

Second Embodiment

Figure 9:
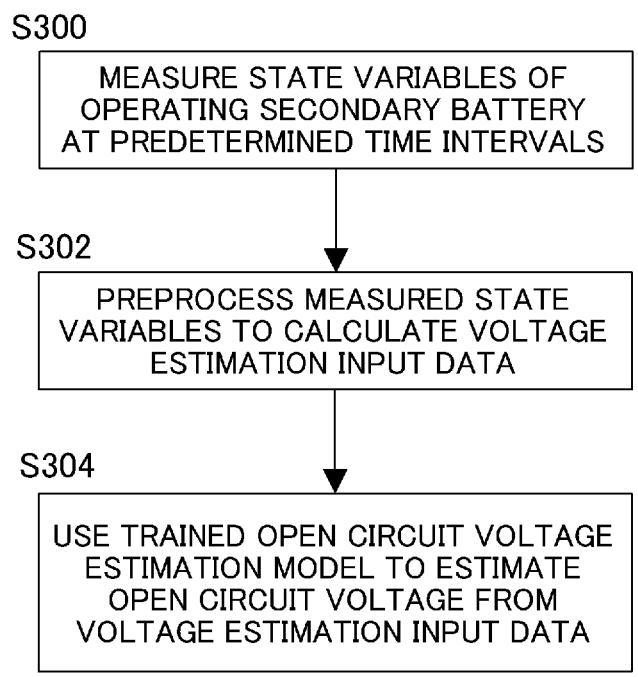
FIG. 9 is a flow chart showing a procedure of an open circuit voltage estimation method according to a second embodiment of the present invention.

The following describes a second embodiment of the present invention. FIG. 9 is a diagram showing a procedure of an open circuit voltage estimation method of a secondary battery according to an embodiment of the present invention. This open circuit voltage estimation method includes a step (S300) of measuring state variables including the terminal currents and terminal voltages of an operating secondary battery to which a load or a charger is connected, at predetermined time intervals; and a step (S302) of preprocessing the measured state variables to calculate voltage estimation input data. In addition, this open circuit voltage estimation method includes a step (S304) of estimating the open circuit voltage of the operating secondary battery from the voltage estimation input data, using an open circuit voltage estimation model trained by a learning method according to the first embodiment described above.

Figure 10:
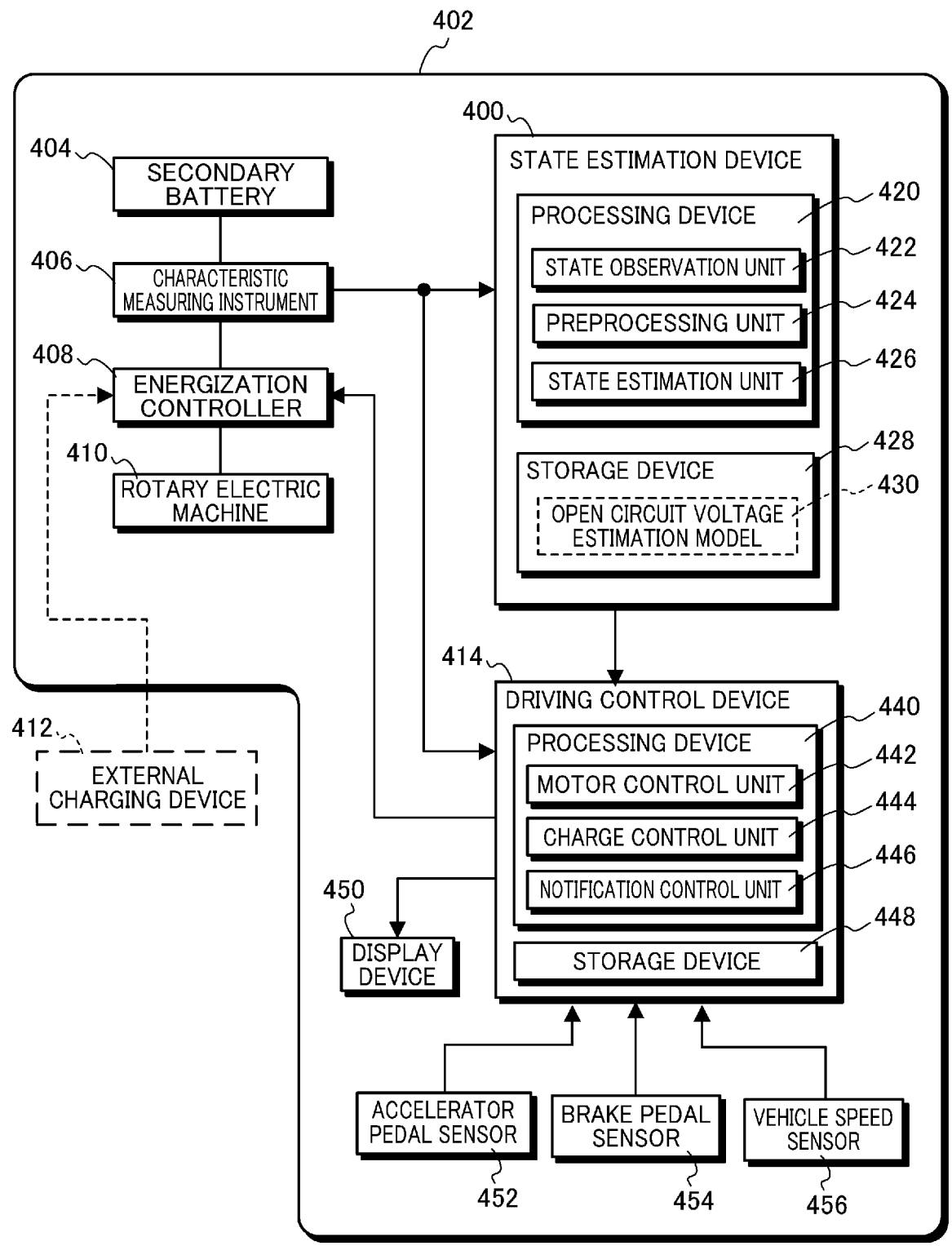
FIG. 10 is a diagram showing a configuration of a state estimation device that executes the open circuit voltage estimation method shown in FIG. 9.

The open circuit voltage estimation method shown in FIG. 9 is executed, for example, in a state estimation device 400 shown in FIG. 10. The state estimation device 400 estimates the state of the secondary battery 404, which is mounted on a vehicle 402 that is an electric vehicle and is operating as an in-vehicle battery of the vehicle 402, for example. The secondary battery 404 is connected to a rotary electric machine 410 via a characteristic measuring instrument 406 and an energization controller 408.

The rotary electric machine 410 functions as a motor that is powered by the discharge from the secondary battery 404 to drive the wheels of the vehicle 402, and also functions as a generator that generates electricity by the rotational force transmitted from the wheels and charges the secondary battery 404.

The characteristic measuring instrument 406 measures the present value of the state variable including the terminal current Ite and the terminal voltage Vte of the secondary battery 404. The energization controller 408 controls the amount of electricity from the secondary battery 404 to the rotary electric machine 410 and the amount of electricity from the rotary electric machine 410 to the secondary battery 404 under the control of a driving control device 414 mounted on the vehicle 402. When an external charging device 412 outside the vehicle 402 is connected to the vehicle 402, the energization controller 408 controls the amount of electricity supplied from the external charging device 412 to the secondary battery 404 under the control of the driving control device 414. The external charging device 412 is, for example, a charger in a charging stand. The energization controller 408 can also control the amount of electricity from the generator to the secondary battery when another generator driven by the internal combustion engine is mounted on the vehicle 402.

The driving control device 414 acquires the estimated values of the present SOC and SOH indicating the state of the secondary battery 404 from the state estimation device 400, and uses the acquired SOC and SOH to control the operation of the rotary electric machine 410 and notify the user.

Specifically, the driving control device 414 has a processing device 440 and a storage device 448. The storage device 448 is, for example, a semiconductor memory, and stores data necessary for processing in the processing device 440.

The processing device 440 is, for example, a computer including a processor such as a CPU. The processing device 440 may be configured to include a ROM in which a program is written, and a RAM for temporarily storing data. The processing device 440 includes a motor control unit 442, a charge control unit 444, and a notification control unit 446, as functional elements or functional units.

These functional elements included in the processing device 440 are embodied, for example, by the processing device 440, which is a computer, executing a program. Note that the computer program can be stored in any computer-readable storage medium. Alternatively, all or part of the functional elements included in the processing device 440 may be configured by hardware including one or more electronic circuit components.

The motor control unit 442 detects the amount of depression of the accelerator pedal (not shown) of the vehicle 402 from the accelerator pedal sensor 452. When the accelerator pedal is depressed, the driving control device 414 instructs the energization controller 408 to energize the rotary electric machine 410 from the secondary battery 404, and operates the rotary electric machine 410 as a motor to drive the vehicle 402. Furthermore, driving control device 414 controls the rotation speed of the rotary electric machine 410 via the energization controller 408 so that the speed of the vehicle 402 acquired from the vehicle speed sensor 456 is a speed corresponding to the amount of depression of the accelerator pedal.

At that time, the motor control unit 442 uses the estimated value of the present SOC acquired from the state estimation device 400, to limit the upper limit value (maximum flowing current) of the current flowing from the secondary battery 404 to the rotary electric machine 410, for example, when the vehicle 402 is accelerating or traveling at a constant speed. In other words, for example, the motor control unit limits the torque generated by the rotary electric machine 410 to limit the discharge of the secondary battery 404. For that, the motor control unit determines the maximum flowing current so that the fuel efficiency (for example, the mileage per 1 kWh) determined from the characteristics of the secondary battery 404 and the rotary electric machine 410 is not less than a predetermined value.

The charge control unit 444 determines whether the brake pedal (not shown) of the vehicle 402 is depressed by the brake pedal sensor 454. Then, when the brake pedal is depressed, the charge control unit 444 instructs the motor control unit 442 to stop the energization from the secondary battery 404 to the rotary electric machine 410. Then, the charge control unit 444 instructs the energization controller 408 to energize the secondary battery 404 from the rotary electric machine 410 to operate the rotary electric machine 410 as a generator, and thereby charges the secondary battery 404 from the rotary electric machine 410, which is called regenerative braking operation.

Furthermore, when the external charging device 412 is connected to the vehicle 402, the charge control unit 444 controls the amount of power supplied from the external charging device 412 to the secondary battery 404 via the energization controller 408.

The notification control unit 446 uses the present SOC estimated value and the SOH estimated value acquired from the state estimation device 400, to make a predetermined display on the display device 450. For example, the notification control unit 446 simply displays the acquired present SOC estimated value and SOH estimated value on the display device 450. Alternatively, for example, the notification control unit 446 displays a message, on the display device 450, suggesting that the driver charge the vehicle 402 at the charging stand when the SOC estimated value falls below a predetermined value. Alternatively, for example, the notification control unit 446 displays a message, on the display device 450, suggesting the driver of the vehicle 402 to replace the secondary battery 404 when the SOH estimated value falls below a predetermined value.

The state estimation device 400 executes the open circuit voltage estimation method shown in FIG. 9 to estimate the open circuit voltage of the operating secondary battery 404. Then, the state estimation device 400 estimates the SOC and SOH of the secondary battery 404 based on the estimated open circuit voltage, and outputs the present SOC estimated value and the SOH estimated value to the driving control device 414.

Specifically, the state estimation device 400 has a processing device 420 and a storage device 428. The storage device 428 is composed of a non-volatile and volatile semiconductor memory. The storage device 428 stores the open circuit voltage estimation model 124 trained by the learning method according to the first embodiment, in advance, as the open circuit voltage estimation model 430, respectively.

The processing device 420 is, for example, a computer including a processor such as a CPU. The processing device 420 may be configured to include a ROM in which a program is written, and a RAM for temporarily storing data. The processing device 420 includes a state observation unit 422, a preprocessing unit 424, and a state estimation unit 426 as functional elements or functional units.

These functional elements included in the processing device 420 are embodied, for example, by the processing device 420, which is a computer, executing a program. Note that the computer program can be stored in any computer-readable storage medium. Alternatively, all or part of the functional elements included in the processing device 420 may be configured by hardware including one or more electronic circuit components.

FIG. 15 shows a functional block diagram of the processing device 420 having the state observation unit 422, the preprocessing unit 424, and the state estimation unit 426. In FIG. 15, the dotted rectangles each indicate processing in the preprocessing unit 424.

A state observation unit 422 executes the step S300 of the open circuit voltage estimation method shown in FIG. 9. In other words, the state observation unit 422 acquires the state variables of the secondary battery 404 including the terminal currents Ite(t) and the terminal voltages Vte(t) of the operating secondary battery 404, from a characteristic measuring instrument 406, at predetermined time intervals. As a result, the state observation unit 422 obtains time-series data of the state variables measured at the predetermined time intervals.

The preprocessing unit 424 executes the step S302 of the open circuit voltage estimation method shown in FIG. 9. In other words, the preprocessing unit 424 preprocesses the state variables acquired by the state observation unit 422 to calculate the voltage estimation input data. Specifically, the preprocessing unit 424 uses the time-series data of the terminal currents Ite and the time-series data of the terminal voltages Vte acquired by the state observation unit 422, to calculate the current difference δIte, which is the difference of the terminal currents Ite, and the voltage difference δVte, which is the difference of the terminal voltages Vte (process 500 shown in FIG. 11). Then, the preprocessing unit 424 calculates the difference gradient Sdiff, which is the change rate of the voltage difference δVte with respect to the current difference δIte (process 502 shown in FIG. 11).

Figure 11:
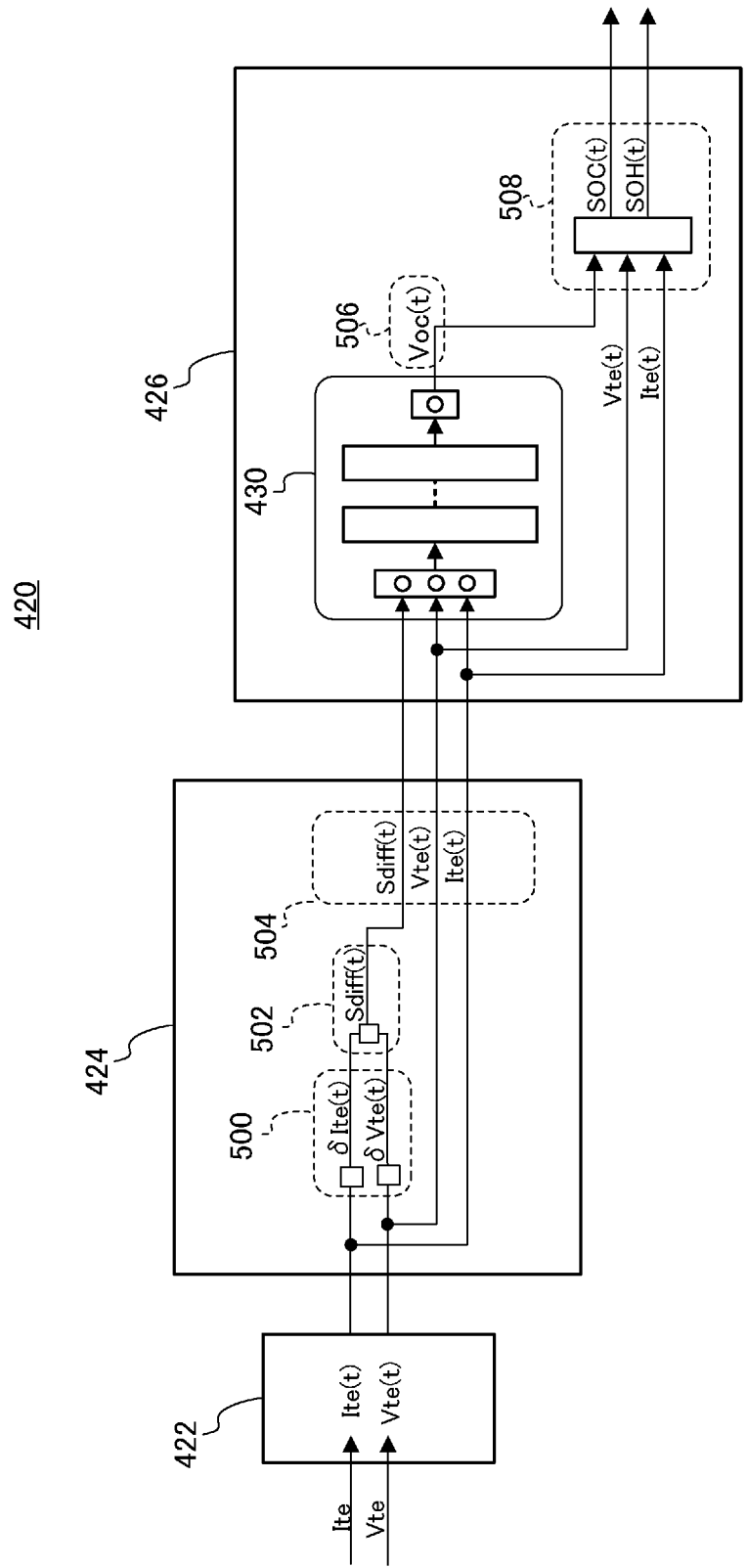
FIG. 11 is a functional block diagram of a processing device included in the state estimation device shown in FIG. 10.

Then, the preprocessing unit 424 generates the voltage estimation input data including each of time-series data of the terminal currents Ite, the terminal voltages Vte, and Sdiff calculated above in a period to the present from a past that goes back a predetermined time T2 from the present (process 504 in FIG. 11).

Next, the state estimation unit 426 executes the step S304 of the open circuit voltage estimation method shown in FIG. 9. In other words, the state estimation unit 426 estimates the open circuit voltage Voc of the operating secondary battery 404, from the generated voltage estimation input data, by using the trained open circuit voltage estimation model (process 506 in FIG. 11).

Then, the state estimation unit 426 uses, for example, time-series data of the open circuit voltages Voc, the terminal voltages Vte, and the terminal currents Ite, in a period to the present from a past that goes back a predetermined time T3 from the present, as input, to estimate SOC and SOH as the present state of the secondary battery 404 (process 508 in FIG. 11), according to the prior art. For example, the state estimation unit 426 can calculate the present SOC of the secondary battery 404 based on the SOC-OCV characteristics of the secondary battery 404 and the Voc included in the state estimation input data.

The present invention is not limited to the configuration of the above embodiments, and can be implemented in various aspects without departing from the gist thereof.

For example, in the first and second embodiments, the current difference δIte and the voltage difference δVte are respectively the fourth-order difference $\Delta^4$Ite of the terminal currents and the fourth-order difference $\Delta^4$Vte of the terminal voltages. However, the current difference δIte and the voltage difference δVte do not necessarily need to be the fourth-order difference. If the current difference δIte and the voltage difference δVte are, for example, the first-order differences A'Ite and A'Vte, the open circuit voltage estimation model 124 can learn the relationship of the behavior of the change (gradient) of the terminal current vs. the terminal voltages with the open circuit voltage. However, a fourth-order or higher-order difference can extract more common change modes of terminal current and terminal voltage among secondary batteries with different electrical characteristics. Therefore, the fourth-order or higher-order difference is preferable from the viewpoint of more accurately estimating the open circuit voltage for secondary batteries of different manufacturers and models.

In addition, the voltage estimation input data may additionally include time-series data of the temperatures of the secondary battery 102. This can further improve the estimation accuracy of the open circuit voltage by the open circuit voltage estimation model 124.

In addition, in the above-described embodiment, the open circuit voltage estimation model 124 is an RNN, which easily handles continuous data in chronological order as input. However, the configuration of the open circuit voltage estimation model is not limited to the RNN.

For example, the open circuit voltage estimation model 124 may be configured by a one-dimensional CNN (Convolutional Neural Network). Also in this case, the voltage estimation input data (expressions (1)) expressed by the second-order tensor can be input to the open circuit voltage estimation model 124, respectively.

Furthermore, in the above-described second embodiment, an example of the device for executing the step S304 of estimating the open circuit voltage of the operating secondary battery is the state estimation device 400 for estimating the state of the operating secondary battery 404 that is mounted on the vehicle 402. However, the step S304 of estimating the open circuit voltage of the operating secondary battery is not limited to the secondary battery for vehicles, and can be used for estimating the state of a secondary battery used for any purpose such as a mobile phone, a bicycle, and a home.

In addition, in the second embodiment described above, the open circuit voltage estimation method shown in FIG. 9 is performed in the state estimation device 400 that estimates the state of the secondary battery. However, this is only an example, and the open circuit voltage estimation method may be executed in a single device that only estimates the open circuit voltage. Alternatively, the open circuit voltage estimation method may be executed in a device having various other functions. For example, the open circuit voltage estimation method shown in FIG. 9 can be executed in a controller that controls the load of the secondary battery. As a specific example, in FIG. 10, for example, the state observation unit 422, the preprocessing unit 424, and the state estimation unit 426, which are included in the processing device 420 of the state estimation device 400, may be embodied by the processing device 440 of the driving control device 414. In this case, the open circuit voltage estimation model 430 stored in the storage device 428 are stored in the storage device 448 of the driving control device 414.

As described above, the learning method of the open circuit voltage estimation model according to the first embodiment includes the step S100 of measuring state variables including the terminal currents Ite and the terminal voltages Vte of the secondary battery 102, to which the load 106 or the charger 104 is connected, at predetermined time intervals. In addition, this learning method includes the step S102 of preprocessing the state variables to calculate the voltage estimation input data $^Vx1(t_n)$, and the step S104 of training the open circuit voltage estimation model 124 to learn the relationship between the voltage estimation input data $^Vx1(t_n)$ and the open circuit voltage Voc of the secondary battery 102, by machine learning. Then, the step S102 of calculating the voltage estimation input data $^Vx1(t_n)$ uses the time-series data of the terminal currents Ite and the time-series data of the terminal voltages Vte to calculate a current difference δIte, and a voltage difference δVte (S200). The current difference δIte is the difference of the terminal currents Ite, and the voltage difference δVte is the difference of the terminal voltages Vte. Furthermore, the step S102 uses the time-series data of the current differences δIte and the time-series data of the voltage differences δVte, to calculate the difference gradient Sdiff (S202). The difference gradient Sdiff is the change rate of the voltage differences δVte with respect to the current differences δIte, in the period to the present from the past that goes back a first predetermined time T1 from the present. Then, the step S102 generates voltage estimation input data $^Vx1(t_n)$ including time-series data of the terminal currents Ite, time-series data of the terminal voltages Vte, and time-series data of the difference gradients Sdiff (S204).

According to this learning method, the generated open circuit voltage estimation model can accurately estimate the open circuit voltage of secondary batteries having various electrical characteristics of different manufacturers and models.

The difference gradient Sdiff is calculated using the least squares method. This configuration can prevent a decrease in the estimation accuracy of the open circuit voltage due to a measurement error of a state variable in the generated open circuit voltage estimation model.

Furthermore, the current difference δIte and the voltage difference δVte are respectively the fourth-order difference $\Delta^4$Ite of the time-series data of the terminal currents Ite and the fourth-order difference $\Delta^4$Vte of the time-series data of the terminal voltage Vte. This configuration uses higher-order change mode of the terminal current Ite and terminal voltage Vte that secondary batteries with different electrical characteristics can have more commonly, and thereby can more accurately estimate the open circuit voltage of secondary batteries with various electrical characteristics of different manufacturers and models, by the open circuit voltage estimation model.

The open circuit voltage estimation model 124 is configured of an RNN or a one-dimensional CNN. Furthermore, the intermediate layer of the RNN configuring the open circuit voltage estimation model 124 may be configured by an LSTM or a GRU. This configuration can efficiently handle the time-series data of a plurality of variables and effectively train the open circuit voltage estimation model.

In addition, the open circuit voltage estimation model 124 is generated by learning using time-series data of state variables including the terminal currents Ite and the terminal voltages Vte for each of a plurality of secondary batteries 102, to which the load 106 or the charger 104 is connected, having different electrical characteristics. This configuration can generate an open circuit voltage estimation model that can accurately estimate the open circuit voltage of secondary batteries having various electrical characteristics of different manufacturers and models.

In addition, the open circuit voltage estimation method of the secondary battery according to the second embodiment described above includes the step S300 of measuring state variables including the terminal currents and the terminal voltages of the operating secondary battery at predetermined time intervals, and the step S302 of preprocessing the state variables to calculate the voltage estimation input data. Furthermore, this open circuit voltage estimation method includes the step S304 of estimating the open circuit voltage of the operating secondary battery from the voltage estimation input data, using the trained open circuit voltage estimation model by the learning method shown in the first embodiment, Then, the step S302 of calculating the voltage estimation input data uses the time-series data of the terminal currents and the time-series data of the terminal voltages to calculate the current difference, and the voltage difference. The current difference is the difference of the terminal currents, and the voltage difference is the difference of the terminal voltages (process 500 in FIG. 11). The step S302 uses the time-series data of the current differences and the time-series data of the voltage differences, to calculate the difference gradient Sdiff (process 502 in FIG. 11). The difference gradient is the change rate of the voltage differences with respect to the current differences, in the period to the present from the past that goes back a first predetermined time T1 from the present. The step S302 generates the voltage estimation input data including time-series data of the terminal currents, time-series data of the terminal voltages, and time-series data of the difference gradient (process 504 in FIG. 11).

This configuration can accurately estimate the open circuit voltage of secondary batteries having various electrical characteristics of different manufacturers and models in operation of these secondary batteries.

The state estimation device 400 according to the second embodiment includes: the state observation unit 422 that measures state variables including the terminal currents and terminal voltages of the operating secondary battery 404 at predetermined time intervals; the preprocessing unit 424 that preprocesses the state variables measured by the state observation unit 422 to calculate the input data; and the state estimation unit 426 that estimates the present charge rate and/or deterioration degree of the secondary battery 404 based on the calculated input data. Then, the state estimation unit 426 estimates the present open circuit voltage of the secondary battery 404 using the trained open circuit voltage estimation model 430 by the learning method according to the first embodiment, and uses the estimated open circuit voltage to estimate the present charge rate and/or deterioration degree of the secondary battery 404. This configuration can accurately estimate the open circuit voltage of the secondary batteries with various electrical characteristics of different manufacturers and models in operation of these secondary batteries, and thereby can accurately estimate the state of these secondary batteries.

REFERENCE SIGNS LIST

100 . . . machine learning device, 102, 404 . . . secondary battery, 104 . . . charger, 106 . . . load, 108 . . . changeover switch, 110, 406 . . . characteristic measuring instrument, 112 . . . learning management device, 120, 420, 440 . . . processing device, 122, 428, 448 . . . storage device, 124, 430 . . . open circuit voltage estimation model, 130 . . . state variable measuring unit, 132 . . . input data generation unit, 134 . . . model learning unit, 200, 202, 204 . . . approximate straight line, 300, 310 . . . input layer, 302, 312 . . . intermediate layer, 304, 314 . . . output layer, 400 . . . state estimation device, 402 . . . vehicle, 408 . . . energization controller, 410 . . . rotary electric machine, 412 . . . external charging device, 414 . . . driving control device, 422 . . . state observation unit, 424 . . . preprocessing unit, 426 . . . state estimation unit, 442 . . . motor control unit, 444 . . . charge control unit, 446 . . . notification control unit, 450 . . . display device, 452 . . . accelerator pedal sensor, 454 . . . brake pedal sensor, 456 . . . vehicle speed sensor, 500, 502, 504, 506, 508, 510, 512, 514, 516, 518 . . . process, 600, 602, 604, 606 . . . line

What is claimed is:

1. An open circuit voltage estimation method of a secondary battery performed by a processor, wherein the secondary battery is included in a vehicle powered by the secondary battery, and the secondary battery is connected to a load or a charger, the method comprising:
 a step of measuring state variables at predetermined time intervals, the state variables including terminal currents and terminal voltages of the secondary battery in operation;
 a step of calculating voltage estimation input data by preprocessing the state variables; and
 a step of estimating an open circuit voltage of the operating secondary battery, from the voltage estimation input data, using an open circuit voltage estimation model trained by a learning method of the open circuit voltage estimation model of the secondary battery which estimates the open circuit voltage of the operating secondary battery, the open circuit voltage estimation model being stored in a memory,
 wherein the learning method comprises a step of training the open circuit voltage estimation model to learn a relationship of the voltage estimation input data with the open circuit voltage of the operating secondary battery, by machine learning,
 wherein the step of calculating:
  uses time-series data of the terminal currents and time-series data of the terminal voltages to calculate current differences and voltage differences, each current difference being a difference in the terminal currents, each voltage difference being a difference in the terminal voltages;

uses time-series data of the current differences and time-series data of the voltage differences to calculate difference gradients, each difference gradient being a change rate of the voltage differences with respect to the current differences in a period to a present from a past that goes back a first predetermined time from the present; and generates the voltage estimation input data including time-series data of the terminal currents, time-series data of the terminal voltages, and timeseries data of the difference gradients.

2. The open circuit voltage estimation method of claim 1, wherein the difference gradients are calculated using a least squares method.

3. The open circuit voltage estimation method of claim 1, wherein the current differences and the voltage differences are respectively a fourth-order difference of time-series data of the terminal currents and a fourth-order difference of time-series data of the terminal voltages.

4. The open circuit voltage estimation method of claim 1, wherein the open circuit voltage estimation model is configured of an RNN (Recurrent Neural Network).

5. The open circuit voltage estimation method of claim 4, wherein an intermediate layer of the RNN configuring the open circuit voltage estimation model is configured of an LSTM (Long Short Term Memory) or a GRU (Gated Recurrent Unit).

6. The open circuit voltage estimation method of claim 1, wherein the open circuit voltage estimation model is configured of a one-dimensional CNN (Convolutional Neural Network).

7. The open circuit voltage estimation method of claim 1, wherein the open circuit voltage estimation model is generated by learning using time-series data of state variables including terminal currents and terminal voltages for each of a plurality of secondary batteries with different electrical characteristics, the secondary batteries each being connected to a load or a charger.

8. A state estimation device of a secondary battery,
the state estimation device estimating a state of the secondary battery in operation, the secondary battery included in a vehicle powered by the secondary battery, the secondary battery being connected to a load or a charger, the state estimation device comprising a processor and a memory in which an open circuit voltage estimation model is stored,
wherein the processor is configured to:
measure state variables at predetermined time intervals, the state variables including terminal currents and terminal voltages of the operating secondary battery;
perform preprocessing of the measured state variables, to calculate input data; and
perform estimation of a present charge rate and/or a deterioration degree of the operating secondary battery, based on the input data,
wherein in the estimation, the processor: estimates a present open circuit voltage of the operating secondary battery, using the open circuit voltage estimation model trained by a learning method of the open circuit voltage estimation model of the secondary battery; and uses the estimated open circuit voltage to estimate the present charge rate and/or the deterioration degree of the operating secondary battery,
wherein the learning method of the open circuit voltage estimation model of the secondary battery estimates an open circuit voltage of the operating secondary battery, and the learning method comprises a step of training the open circuit voltage estimation model to learn a relationship of the input data with the open circuit voltage of the secondary battery in operation, by machine learning.

9. The state estimation device of claim 8, wherein time-series data of the terminal currents and time-series data of the terminal voltages are used to calculate current differences and voltage differences, each current difference being a difference in the terminal currents, each voltage difference being a difference in the terminal voltages, and time-series data of the current differences and time-series data of the voltage differences are used to calculate difference gradients, each difference gradient being a change rate of the voltage differences with respect to the current differences in a period to a present from a past that goes back a first predetermined time from the present, and the difference gradients are calculated using a least squares method.

10. The state estimation device of claim 9, wherein the current differences and the voltage differences are respectively a fourth-order difference of time-series data of the terminal currents and a fourth-order difference of time-series data of the terminal voltages.

11. The state estimation device of claim 8, wherein the open circuit voltage estimation model is configured of an RNN (Recurrent Neural Network).

12. The state estimation device of claim 11, wherein an intermediate layer of the RNN configuring the open circuit voltage estimation model is configured of an LSTM (Long Short Term Memory) or a GRU (Gated Recurrent Unit).

13. The state estimation device of claim 8, wherein the open circuit voltage estimation model is configured of a one-dimensional CNN (Convolutional Neural Network).

14. The state estimation device of claim 8, wherein the open circuit voltage estimation model is generated by learning using time-series data of state variables including terminal currents and terminal voltages for each of a plurality of secondary batteries with different electrical characteristics, the secondary batteries each being connected to a load or a charger.

* * * * *